United States Patent [19]

Sado et al.

[11] 4,380,726
[45] Apr. 19, 1983

[54] BATTERY SERVICE LIFE INDICATOR

[75] Inventors: Ichiro Sado; Toshiaki Ozawa, both of Tokyo, Japan

[73] Assignee: Canon Kabushiki Kaisha, Tokyo, Japan

[21] Appl. No.: 925,748

[22] Filed: Jul. 18, 1978

[30] Foreign Application Priority Data

Jul. 18, 1977 [JP] Japan .................................. 52-85843

[51] Int. Cl.³ .......................................... H01M 10/48
[52] U.S. Cl. ...................................... 320/48; 320/13; 320/37; 340/636
[58] Field of Search ........................................ 320/2-4, 320/48, 43, 37, 38, 44, 13; 340/636; 58/23 BA, 58/50 R; 368/204

[56] References Cited

U.S. PATENT DOCUMENTS

| | | | |
|---|---|---|---|
| 3,898,790 | 8/1975 | Takamune et al. | 368/209 |
| 4,017,724 | 4/1977 | Finger | 320/48 X |
| 4,051,424 | 9/1977 | Privee | 320/48 |
| 4,081,664 | 3/1978 | Washizuka et al. | 58/50 R X |
| 4,122,381 | 10/1978 | Sturm | 320/48 |
| 4,151,454 | 4/1979 | Iida | 320/48 |
| 4,163,360 | 8/1979 | Tanaka et al. | 58/50 R X |

Primary Examiner—Robert J. Hickey
Attorney, Agent, or Firm—Fitzpatrick, Cella, Harper & Scinto

[57] ABSTRACT

The electronic apparatus is provided with a device for informing the operator of information on the service life of the battery employed for driving the electronic apparatus.

16 Claims, 6 Drawing Figures

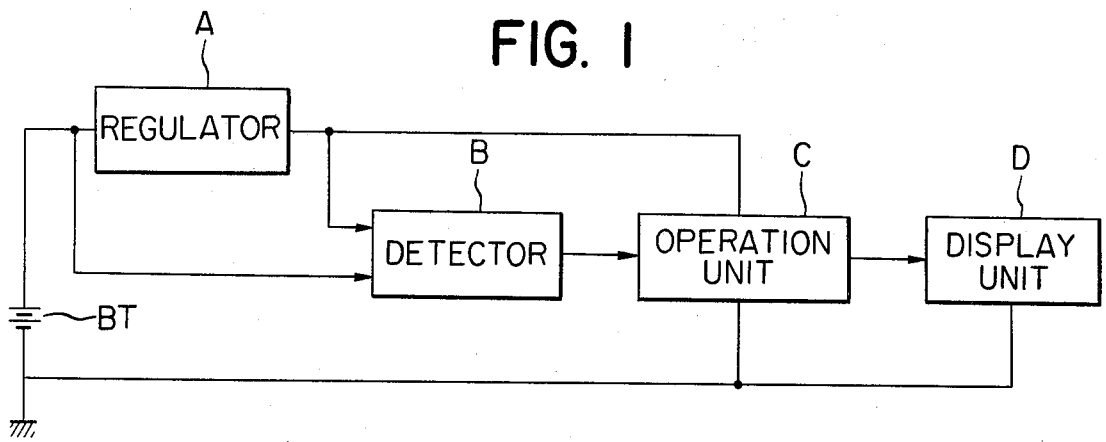
FIG. 1
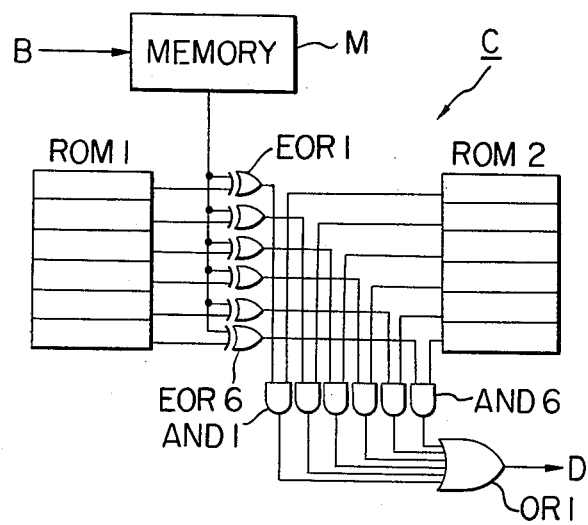
FIG. 2
FIG. 3
| <ROM1> | <ROM2> |
|---|---|
| 4.9 | 6 |
| 4.8 | 5 |
| 4.6 | 4 |
| 4.3 | 3 |
| 3.9 | 2 |
| 3.4 | 1 |

BATTERY SERVICE LIFE INDICATOR

BACKGROUND OF THE INVENTION

1. Field of the Invention

The present invention relates to an electronic apparatus provided with a device for informing the operator of information on the service life of a battery employed for supplying electric power to said electronic apparatus.

In battery-powered electronic apparatus, such as small calculators or digital watches, the remaining service life of the battery is an important concern, because a premature replacement of the battery while it still has enough power is not economical, while extended use of the battery to the power limit thereof may lead to erroneous calculations or destruction of memory contents.

2. Description of the Prior Art

In order to cope with this problem, the recent electronic apparatus are frequently designed to warn the operator through a display of a certain symbol on the display device or through the absence of display when the battery approaches the end of its service life. However such warning devices inevitably give shock to the operator as the warning is presented abruptly during the use of the apparatus.

SUMMARY OF THE INVENTION

In consideration of the foregoing, an object of the present invention is to provide an electronic apparatus providing plural displays of the information on the battery employed in said apparatus.

Another object of the present invention is to provide an electronic apparatus capable of displaying information on service life of the battery employed in said apparatus.

Still other objects of the present invention will be made clear from the following description of the embodiments of the present invention illustrated in the attached drawings.

BRIEF DESCRIPTION OF THE DRAWINGS

FIG. 1 is a block diagram showing an embodiment of the electronic apparatus of the present invention;

FIG. 2 is a detailed block diagram of the operation unit shown in FIG. 1;

FIG. 3 is a drawing showing the content of memories ROM1 and ROM2 shown in FIG. 2;

DESCRIPTION OF THE PREFERRED EMBODIMENTS

Referring to FIG. 1 showing a block diagram of an embodiment of the present invention, there are shown a battery BT, a regulator unit A composed for example of a stabilizing circuit, a power switch etc., a voltage detector unit B of a known structure composed for example of a differential amplifier for comparing the battery voltage with a stabilized voltage, a gate, an analog-to-digital converter, a flip-flop etc., an operation unit C composed for example of an LSI element etc., and a display unit D.

FIG. 2 shows a partial detailed view of the operation unit C shown in FIG. 1 wherein there are shown a memory M for storing information on the battery voltage received from the voltage detector unit B, a read-only memory or a register ROM1 storing plural values of battery voltages, a read-only memory or a register ROM2 storing remaining service life times of said battery voltages, coincidence circuits EOR1-6 for comparing the content of memory M with that of memory ROM1 and generating an output signal when said contents mutually coincide or are mutually close, AND gates AND1-6 adapted to select either one of the contents of said memory ROM2 according to the output from said coincidence circuits EOR1-6, an OR gate OR1 for supplying the content of thus selected memory ROM2 to the display unit D.

FIG. 3 shows an example of the contents of said memories ROM1 and ROM2 wherein the previously measured or calculated figures are stored as illustrated. For example the content of memory ROM1 represents the battery voltages while that of memory ROM2 represents the corresponding remaining service life time thereof.

Figure 4:
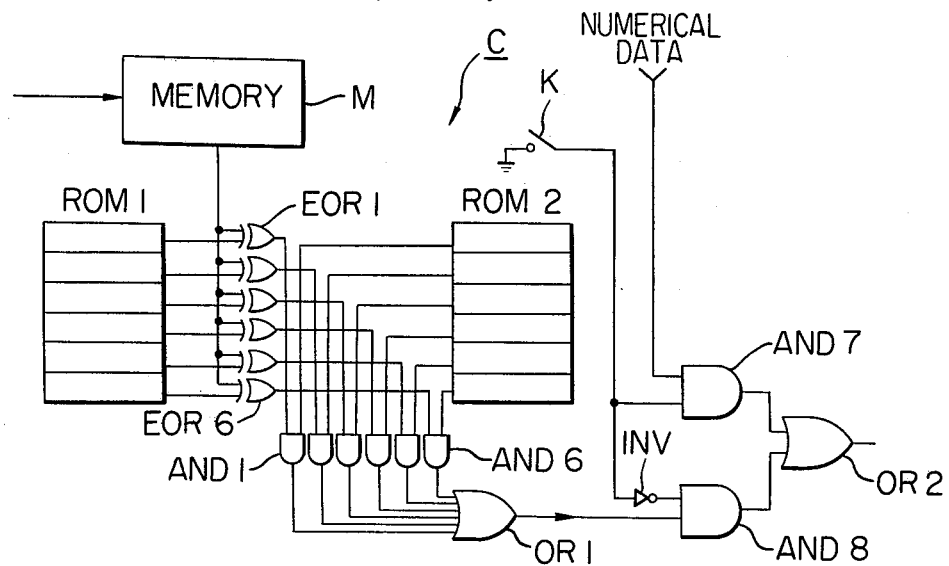
FIG. 4 is a block diagram showing a variation of that shown in FIG. 2.

Now, in case the voltage detector unit B shown in FIG. 1 identifies the battery voltage for example as 4.8 V, a figure 4.8 is memorized in the memory M and compared with the contents of the memory ROM1. Thus a coincidence signal is generated by the coincidence circuit EOR2 and is supplied to the gate AND2, whereby the content "5" of the memory ROM2 is supplied through the OR1 gate to the display unit D to inform the operator of a fact that the battery will be exhausted in 5 hours. With the gradual lowering of the battery voltage thereafter, the information on the remaining service life of battery is given to the operator plural times, for example in 4 hours, in 3 hours etc.

Although the present embodiment has been explained in connection with a case in which the discharge characteristics of the battery are unitary, a correct information on the service life can be displayed even in case a different battery of different discharge characteristics is loaded in the apparatus by identifying the battery through a battery identifying means for example a key operation or through the voltage drop characteristics of the battery and obtaining the remaining service life from a corresponding memory storing the corresponding information on the voltage and remaining service life.

FIG. 4 is a block diagram showing a variation of that shown in FIG. 2, wherein the same components as in FIG. 2 are represented by the same symbols. In FIG. 4 there is provided a switch K which is provided for battery check and which, upon closure thereof, opens an AND gate AND8 to supply the data selected from the memory ROM2 through an OR2 gate to the display unit D. In case the gate K is open, the AND gate AND7 is opened to supply the numerical data in case of a calculator or the time data in case of a watch, to the display unit D, so that the display unit D can be utilized for both purposes.

Figure 5:
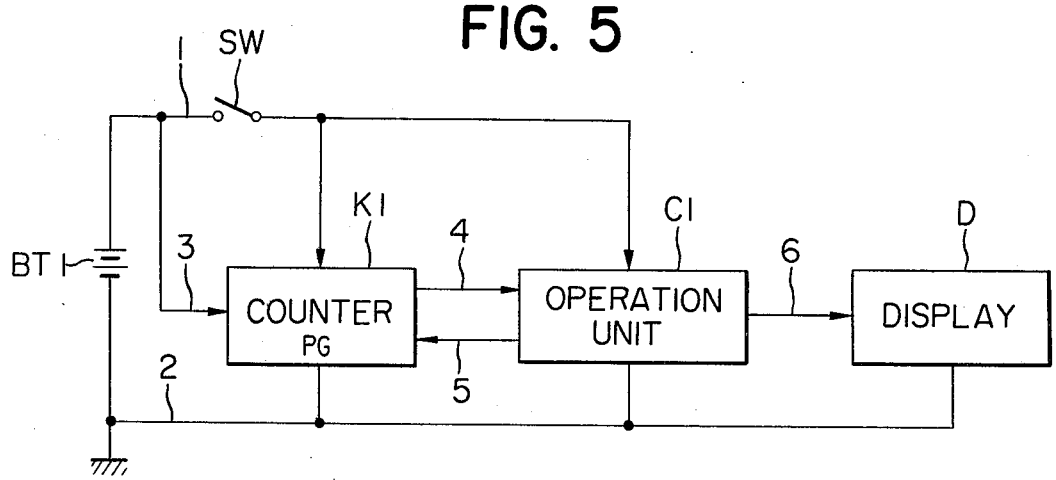
FIG. 5 is a block diagram showing still another embodiment modified from that shown in FIG. 1.

FIG. 5 shows another embodiment of the present invention wherein there are shown a battery BT, a power switch SW, a counter circuit K1 for measuring the time of use of the battery and composed for example of an oscillator, a counter etc., an operation unit C1 composed for example of an LSI element for electronic calculator etc., and a display unit D. 1 and 2 are battery terminal lines, 3 is a constant battery output line bypassing the power switch SW, 4 is a signal line for transmitting information on the used time of the battery, 5 is a demand line for said information, and 6 is a display signal line.

The voltage on the line 3 returns to zero upon removal of an old battery, and, upon insertion of a new battery the counter K1 is cleared by the rise of voltage. The counter K1 is structured in such a manner that it performs the counting operation only when the switch SW is closed and retains the counted data by the voltage supplied through line 3 when the switch SW is opened. In this manner the counter K1 records the cumulative used time of the battery which an be utilized for display or subtracted from the predetermined total service life of the battery to display the remaining service life. Such subtraction can be performed in said operation unit C1.

In case the load current, self-discharge current and current required for holding the counter K1 when the switch SW is open are relatively large and previously known, a further exact prediction of service life can be achieved by a counting operation with slower cycles than in the case when the switch SW is closed.

Figure 6:
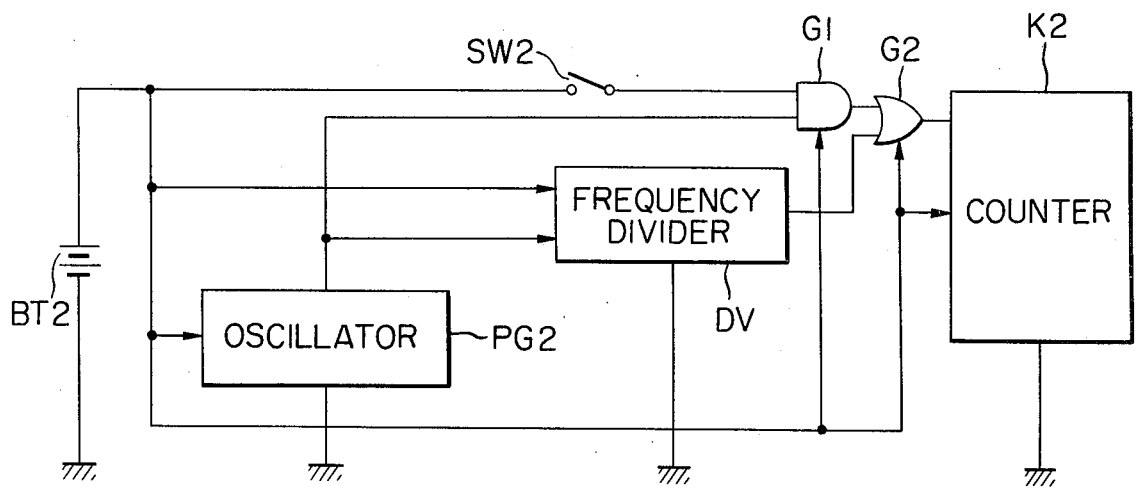
FIG. 6 is a block diagram showing still another embodiment modified from that shown in FIG. 5.

FIG. 6 shows a circuit therefor, in which, when the power switch SW is closed, the oscillation frequency from an oscillator PG2, for example a crystal oscillator, is supplied to a counter circuit K2 through an AND gate G1 and an OR gate G2. On the other hand, when the switch SW2 is open, the oscillation frequency is supplied to the gate G2 through a frequency divider DV which generates a frequency lower by a predetermined ratio than the input frequency. Thus the counter K2 performs a normal counting operation when the switch is closed but performs a slower counting operation when the switch is open. In this manner an exact information on the service life of the battery can be obtained. This embodiment, being provided with a time-measuring function, provides the additional advantage of allowing easy preparation of a calculator etc. provided with watch or stop-watch function. Also the oscillator need not be provided separately in case the present embodiment is applied to a calculator provided with a watch function.

Furthermore, in the present embodiment, as the time counting circuit provided with a frequency divider is capable of counting time with different intervals, it is easily possible to produce for example a slow watch making for example 5 counts per hour or a fast watch by counting the divided signals in normal condition and counting the undivided signals from the oscillator when desired. Furthermore, the switching of frequency is not necessarily limited to the power switch SW but is also achieved automatically by a separate electronic switch functioning in accordance with the mode switching information.

As explained in the foregoing, the apparatus of the present invention is preferable in that the operator is capable of using the apparatus with ease as the information on the battery is displayed plural times.

The apparatus of the present invention is particularly suited for use in combination with battery-powered electronic apparatus, such as an electronic calculator, watch or clock, radio, cassette tape recorder etc.

Although in the foregoing first embodiment the memory means stores the information on the remaining service life or battery in one-to-one correspondence to the output voltage of the battery, it is also possible to obtain information on the service life by storing a formula of discharge characteristics of the battery in the memory means and supplying the information on the output voltage of the battery to said formula. In such case the read-only memory stores the above-mentioned formula and a program for solving said formula.

What we claim is:

1. An electronic apparatus comprising:
   detecting means for detecting a variable output voltage level of a battery;
   storage means for previously storing datum corresponding to a predetermined output voltage level of said battery;
   life time memory means for storing life time datum of said battery, said life time datum being associated with the datum stored in said storage means;
   comparison means for comparing the voltage level detected by said detecting means with the datum stored in said storage means; and
   means for reading out the life time datum stored in said life time memory when said comparison means produces a coincidence of the output voltage level of said battery with the datum stored in said storage means.

2. An electronic apparatus according to claim 1 further comprising:
   numerical display means for displaying the life time datum read out from said reading means.

3. An electronic apparatus comprising:
   detecting means for detecting a variable output voltage level of a battery;
   storage means having a plurality of memory locations for previously storing different data each corresponding to a respective predetermined output voltage level of said battery, and being stored in the associated one of the memory locations, respectively;
   life time memory means having a plurality of memory locations for previously storing different life time data each being associated with the datum stored in each of the memory locations of said storage means, respectively;
   comparison means for comparing the voltage level detected by said detecting means with the data stored in said storage means; and
   means for reading out the associated life time datum stored in said life time memory means when said comparison means produce a coincidence of the output voltage level of said battery with the datum stored in any of the memory locations of said storage means.

4. An electronic apparatus according to claim 3 further comprising:
   numerical display means for displaying the life time data read out from said reading out means.

5. An electronic apparatus comprising:
   switch means for selecting one of a plurality of batteries having different life times;
   means for identifying the battery selected by said switch means;
   detecting means for detecting a variable output voltage level of the selected battery;
   storage means having a plurality of memory locations for previously storing different data each corresponding to a respective predetermined output voltage level of said battery, and being stored in the associated one of the memory locations, respectively;
   a plurality of groups of life time memory means each having a plurality of memory locations for previously storing a set of life time data each being associated with the datum stored in each of the memory locations of said storage means, respectively, wherein the respective sets of life time data in the groups are different from each other in correspondence to said batteries having the different life times;

group selecting means for selecting associated ones of said plurality of groups of life time memory means in accordance with the signal from said battery identifying means;

comparison means for comparing the voltage level detected by said detecting means with the data stored in said storage means; and means for reading out the associated life time datum stored in the life time memory means of the one group selected by said group selecting means when said comparison means produces a coincidence of the output voltage level of said battery with the datum stored in any of the memory locations of said storage means.

6. An electronic apparatus according to claim 1 wherein said storage means comprise a Read Only Memory.

7. An electronic apparatus according to claim 1 wherein said comparison means comprise exclusive OR logic circuit means.

8. An electronic apparatus according to claim 1 wherein said life time memory means comprise a Read Only Memory.

9. An electronic apparatus according to claim 3 wherein said comparison means comprise an exclusive OR logic circuit means.

10. An electronic apparatus according to claim 3 wherein said life time memory means comprise a Read Only Memory.

11. An electronic apparatus according to claim 5 wherein said comparison means comprise an exclusive OR logic circuit means.

12. An electronic apparatus according to claim 5 wherein said life time memory means comprise a Read Only Memory.

13. An electronic apparatus comprising:
storage means for storing data representative of a life time of a battery;
time counting means for counting time;
detecting means for detecting a coincidence of the output of said time counting means and the life time data stored in said storage means;
means responsive to the coincidence output from said detecting means for informing an operator of the termination of the life time of said battery; and
reset means responsive to a leading edge of the output level of said battery incorporated with said electronic apparatus for clearing said time counting means.

14. An electronic apparatus according to claim 13 further comprising control means for causing said time counting means to change the time counting basis in accordance with the status of operation of said battery.

15. An electronic apparatus comprising:
detecting means for detecting an output level of a battery incorporated with said apparatus;
electronic read only memory means having a plurality of memory address locations for previously storing different data each being representative of the remainder of the life time of the battery associated with a respective predetermined output level of the battery, and each different datum being stored in an associated one of said memory address locations, respectively;
means connected to said memory means and said detecting means for comparing the output level of the battery detected by said detecting means with the predetermined output levels of the battery associated with said different data representative of the remainder of the life time of the battery, and for reading out the datum representative of the remainder of the life time of the battery, from the memory address location in which it is stored, associated with the predetermined output level of the battery detected by said detecting means; and
display means for selectively displaying the remainder of the life time of the battery read out by said comparing and reading out means.

16. An electronic apparatus according to claim 15 wherein said display means includes a numerical display means for displaying the remainder of the life time of the battery.

* * * * *